United States Patent [19]

Sherman, Jr.

[11] 4,148,297

[45] Apr. 10, 1979

[54] COLLECTOR OF DIRECT DISPERSED AND REFLECTED WAVES

[76] Inventor: Benjamin F. Sherman, Jr., 6329 Mori St., McLean, Va. 22101

[21] Appl. No.: 703,461

[22] Filed: Jul. 8, 1976

[51] Int. Cl.$^2$ .................................................. F24J 3/02
[52] U.S. Cl. ...................................... 126/270; 126/271; 350/293
[58] Field of Search ............... 126/270, 271; 237/1 A; 350/293, 294

[56] References Cited

U.S. PATENT DOCUMENTS

| | | | |
|---|---|---|---|
| 2,760,920 | 8/1956 | Olsen | 126/270 |
| 2,987,961 | 6/1961 | Cotton et al. | 126/270 |
| 2,998,002 | 8/1961 | Standig | 126/270 |
| 3,982,527 | 9/1976 | Cheng et al. | 126/271 |
| 4,011,855 | 3/1977 | Eshelman | 126/270 |
| 4,017,028 | 4/1977 | Manor | 237/1 |

*Primary Examiner*—Kenneth W. Sprague

*Attorney, Agent, or Firm*—Otto John Munz

[57] ABSTRACT

A collector of waves, such as of solar radiations entering from any direction, concentrates them upon a receiver that converts them to useful purposes. Moderate concentration factors are achieved without the necessity of tracking the sun. The reflective surface of the collector is a semicircular arc; developed by rotation about an axis either in the plane of the arc passing through the center of curvature to form a hemisphere, or in the plane of the arc and tangent to one end to form a hemitoroid with a central cusp, or about some other axis; or some combination of these shapes. The device is compounded to provide an increased concentration factor. Means are taught for adapting the device to heat-collecting plates, heat pipes, or photovoltaic conversion devices (solar cells) of either disc, ribbon, or tube construction and for installing the device on surfaces of buildings with or without the capability of tracking the sun.

13 Claims, 24 Drawing Figures

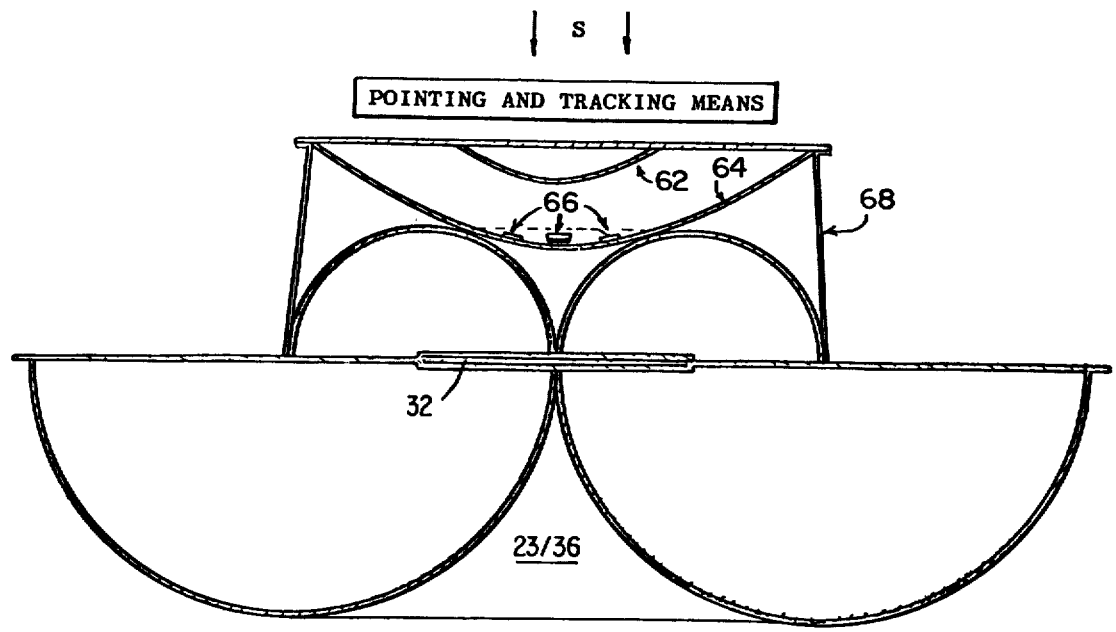
FIG. 2H
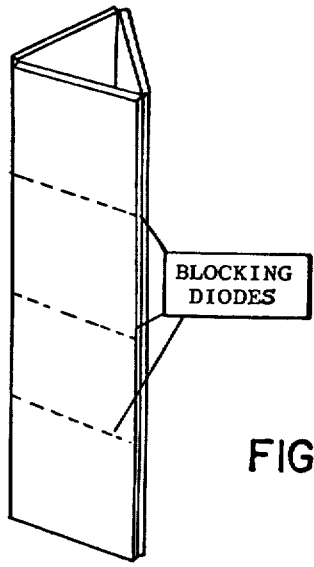
FIG. 3 A
FIG. 3 B
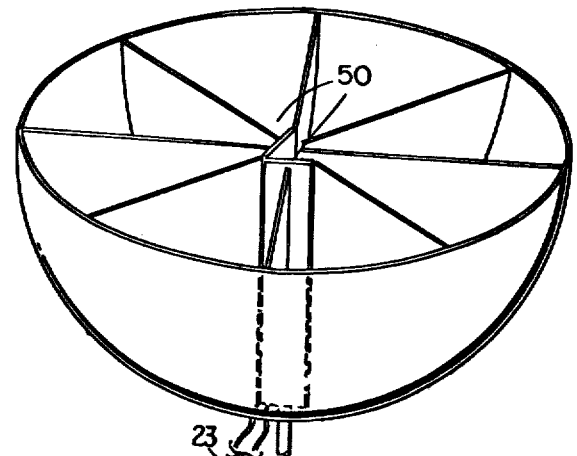

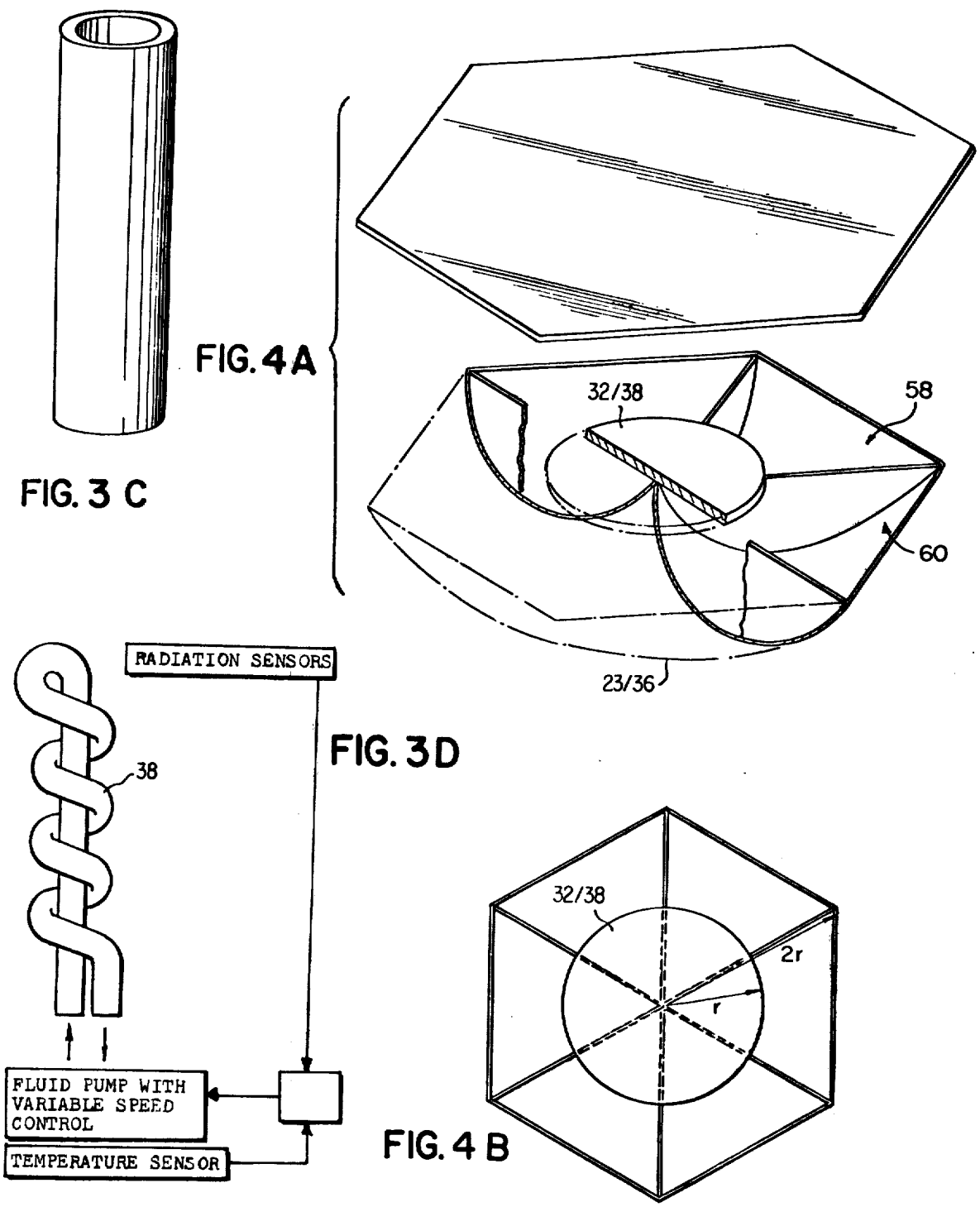

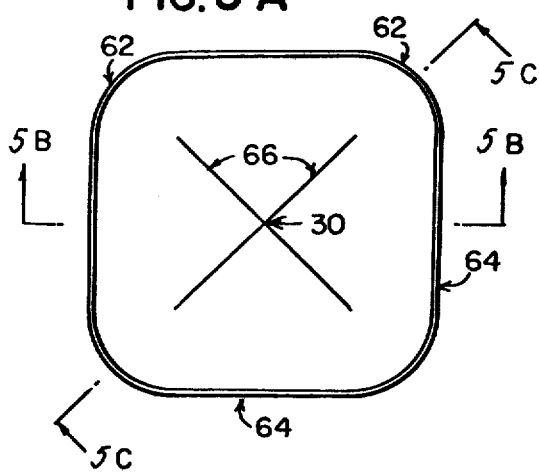
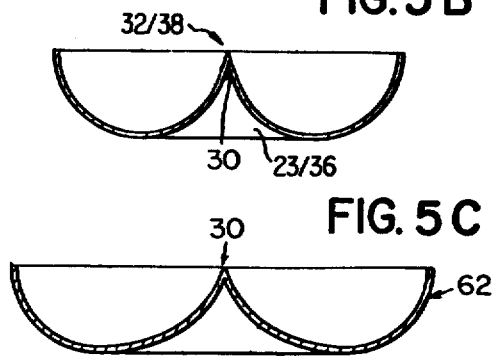
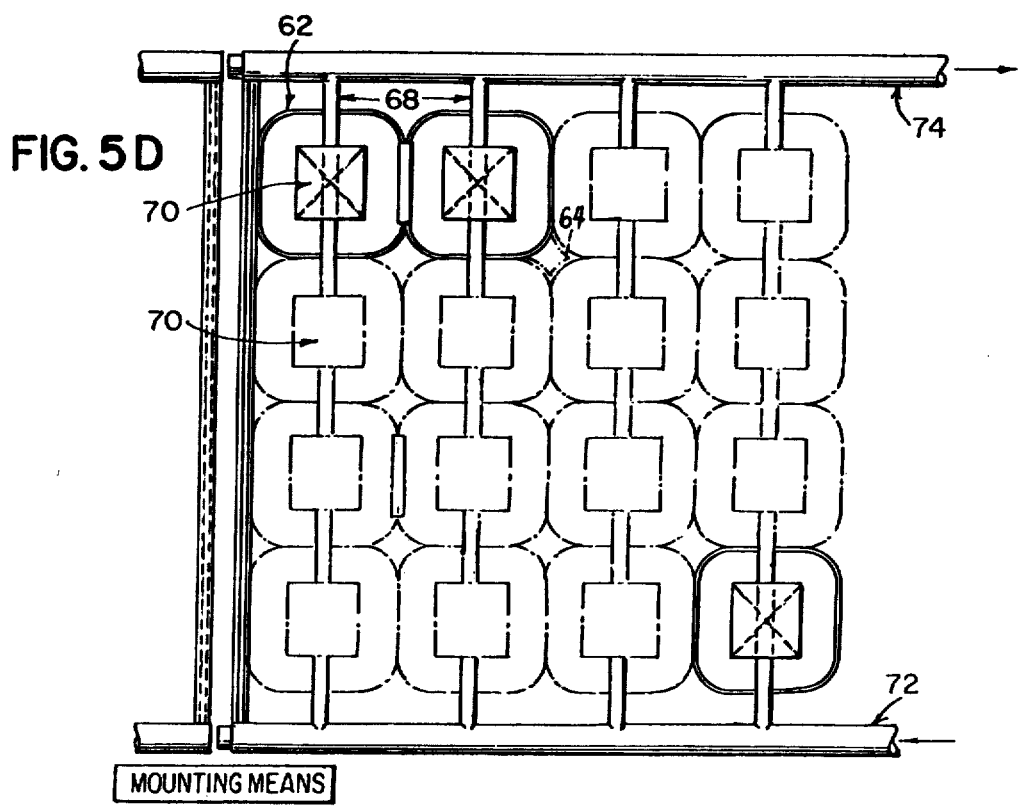
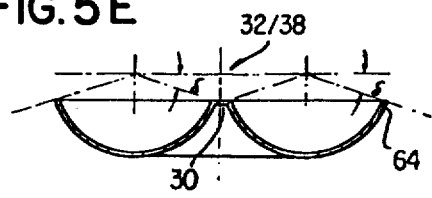
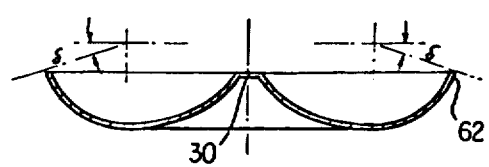

4,148,297

COLLECTOR OF DIRECT DISPERSED AND REFLECTED WAVES

FIELD OF THE INVENTION

Collection of radiant energy, acoustic or electromagnetic, and its conversion (Class 126–27) by accepting virtually all solar radiation, both direct and dispersed, entering the device through a large area and concentrating it upon a receiver of a smaller area for purposes of useful conversion.

DESCRIPTION OF THE PRIOR ART

U.S. Pat. Nos. 2,976,533 to W. W. Salisbury and 3,892,476 to B. F. Sherman Jr. are made of record.

Solar energy collectors of the prior art can be classified generally as flat plate collectors or focusing collectors. Flat plate collectors accept both direct and dispersed radiation but have no reflectors and provide no concentration factor; thus the energy receivers must cover the entire area available for collection.

Such a device requires considerable weight and expense to cover an adequate area and does not offer the possibility of concentrating the energy to attain temperatures near 200° F. necessary for efficient use in some applications, such as absorptive cooling.

Focusing collectors concentrate radiation on to a focal line or a focal point and achieve large concentration factors (1000 or greater), but they can accept only radiation entering parallel to the axis and thus must track the sun. They collect virtually no dispersed radiation so that, when the sun is obscured by clouds, they are useless.

Further, with large concentration factors the required precision of the reflective surface increases the expense.

SUMMARY OF THE INVENTION

The primary objects of the invention are to provide an intermediate type of collector:

that achieves concentration factors of up 2 to 20 or more;

that does not need to track the sun;

that is effective when the sun is at low elevation angles or is obscured;

that accepts direct and dispersed radiation;

that is light in weight and simple and inexpensive to construct and that can be readily adapted to the needs, such as of the building industry, in new as well as in retro constructions, to achieve temperatures over 200° Fahrenheit such as for space or process heating and absorptive cooling.

The cross-section of the reflective surface of the collector is a semicircular arc rotated about an axis either in the plane of the arc and passing through the center of curvature to generate a hemisphere, or in the plane of the arc and tangent to one end to form a hemitoroid with a central cusp, or about some other axis. Such an axis of rotation then becomes the central axis of the collector.

Means are provided to convert the collected radiant energy into a useful output.

Means are provided to mount a plurality of individual collectors into units and arrays thereof to exploit optimally the irradiated area.

Means are provided to track a remote moving Source and to control the angle of the collector so that it intercepts continuously an optimum amount of radiation from such a Source.

Other objects of the invention will become apparent to those skilled in the art from the following description, drawings and claims.

BRIEF DESCRIPTION OF THE DRAWINGS

FIG. 3A is a perspective view of a hemispherical reflector with two centrally located solar cell ribbons and a plurality of skew-ray deflector plates radially disposed within the hemisphere.

FIG. 3B is a perspective view of an alternative arrangement of solar cell ribbons for FIG. 3A.

FIG. 3C is a perspective view of a tubular solar cell for FIG. 4A.

FIG. 3D is a perspective view of a fluid flow receiver for FIGS. 1 and 3A.

FIG. 4A is an exploded perspective view of a hexagonal collector partly in section, of which the reflector has a semicircular cross section.

FIG. 4B is a plan view of the collector of FIG. 4A.

FIG. 5A is a plan view of a toroidal reflector of a generally square design, with a central cusp.

FIG. 5B is a cross section on plane 5B—5B of FIG. 5A.

FIG. 5C is a cross section on plane 5C—5C of FIG. 5A.

FIG. 5D is a plan view showing an array of panels of reflectors of the type shown on FIG. 5A, fitted with flat, square, heat-absorbing plates and pipes for coolant flow.

FIG. 5E is a cross section of an alternative embodiment of FIG. 5A.

FIG. 5F is a cross section taken at 45° to FIG. 5E.

In the drawings the same reference numerals denote the same or functionally equivalent parts. Repetitions of descriptions of parts suitable to function in the various embodiments were omitted in the drawings and the following specification for purposes of brevity.

DESCRIPTION OF THE PREFERRED EMBODIMENTS

Figure 1:
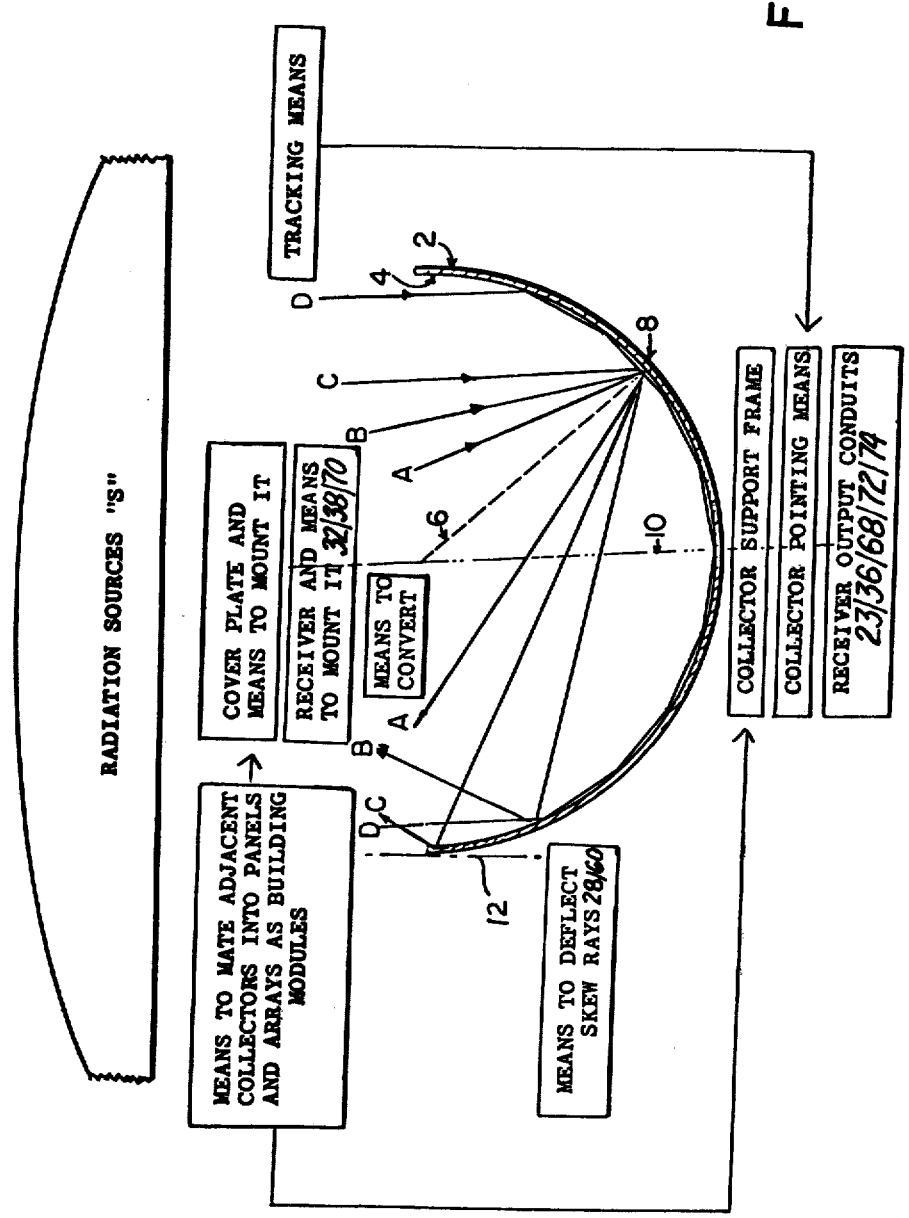
FIG. 1 is a cross-sectional view of a two-dimensional reflector with a semicircularly warped reflecting surface showing reflections of rays from various angles, together with a block diagram disclosing parts common to the various embodiments described hereinafter.

The principles of the invention common to all species are explained with the aid of FIG. 1, where a Source S of direct, indirect and dispersed radiations is shown remotely located from the two-dimensional semicircular reflector 2 whose concave side 4 is reflective. An exemplary radius line 6 connects the center of the semicircle with an intersecting point 8 on the periphery of the reflective arc. Exemplary rays A to C of radiations from the Source impinge upon the intersection point and are reflected in accordance with the well-known law of reflection. An exemplary ray D is shown making multiple reflections.

It is a property of the reflective semicircular shape that all rays entering on one side of the center must exit on the other side, or put another way, that all entering rays must cross all radius lines before exiting.

The reflector

Figure 2A:
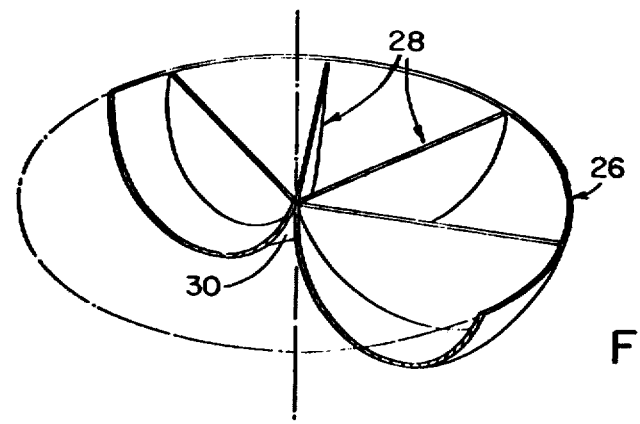
FIG. 2A is a perspective view partly in section of a toroidal reflector with a central cusp and an array of radially disposed skew ray deflector plates.
Figure 2:
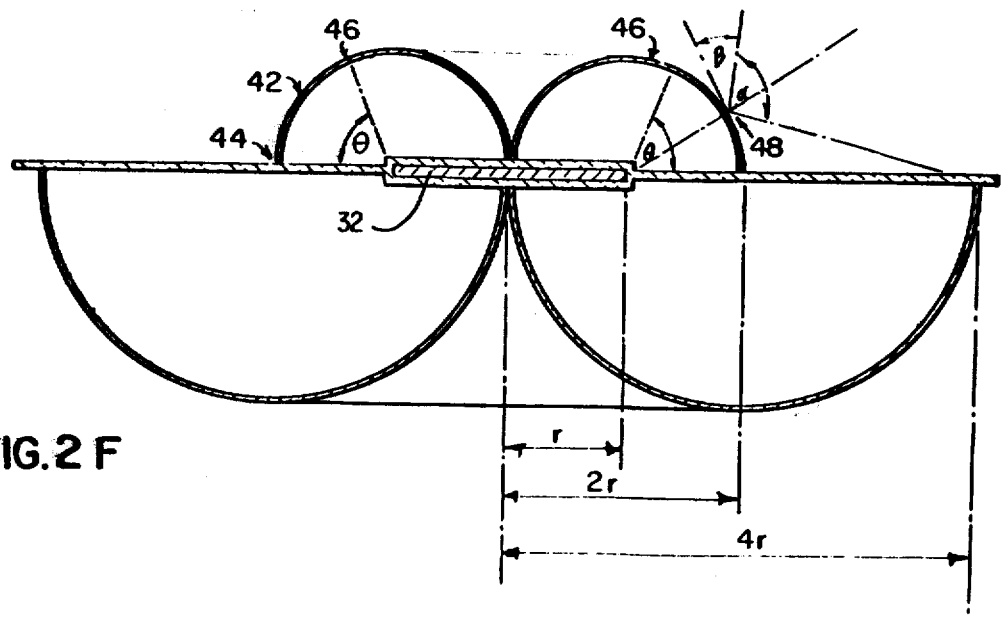
FIG. 2B is a plan view of a toroidal reflector showing an arrangement of skew ray deflector plates.
FIG. 2C is a plan view of a toroidal reflector showing an alternative arrangement of skew-ray deflector plates.
FIG. 2D is a cross section through a toroidal reflector showing a circular solar cell mounted in a transparent cover plate.
FIG. 2E is a view similar to that of FIG. 2D with a heat-absorbing disc and a heat pipe as the energy receiver and transfer means.
FIG. 2F is a cross section of a compound version of FIG. 2D.
FIG. 2G is a cross section of another compound version of FIG. 2D.
FIG. 2H is another embodiment of a compound version of FIG. 2D including a device for tracking the sun.
Figure 2:
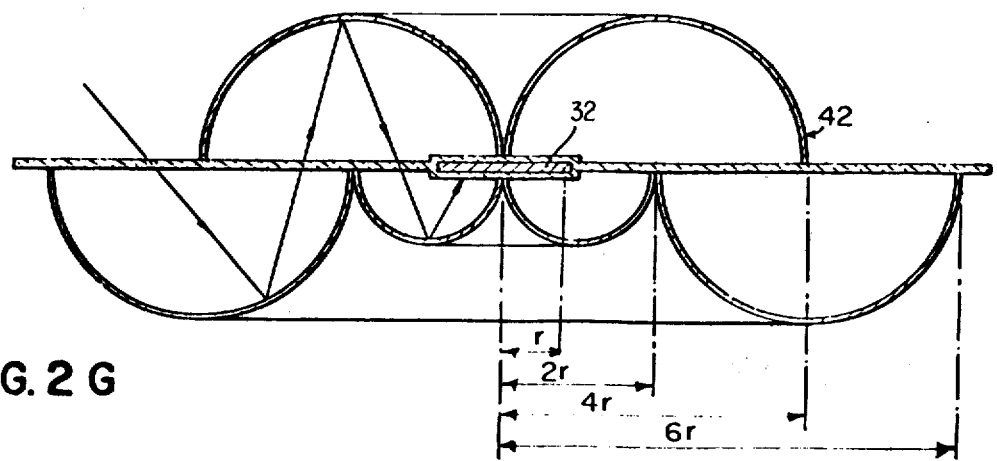

To produce the various embodiments of the invention, the cross-sectional semicircle is rotated either about a central axis 10 to generate a hemisphere shown on FIG. 3A, or about a tangential axis 12 to generate a hemitoroid shown on FIG. 2.

An axis other than those illustrated may be chosen about which to rotate the semicircle to form a reflector that is toroidal but with a reduced central cusp, or toroidal with a central hole.

The shapes of the reflectors are easily rolled or stamped out of lightweight aluminum with the concave side being polished or some forms can be easily molded of glass or plastic material with the concave side then being aluminized to produce a highly reflective surface. In practice some thin protective coating, or a cover such as of clear glass, plastic or silicon monoxide, protects the mirrored surface or it is anodized to protect from weathering. Some of the forms can be readily produced by inflating aluminized mylar film as described in U.S. Pat. No. 3,607,584.

The receiver

The collector in every embodiment of the invention is provided with a radiation receiver such as 20,32,38,50, or 70, mounted relative to the central axis of the collector's respective reflective surfaces either vertically or horizontally and having a shape, dimension and location of surfaces such that all radiations entering the collector impinge upon the receiver either directly or after one or more reflections from the reflector. Conventional radiation receiving materials, capable of converting the radiations to practical use, such as blackened plates and fluid conduits or silicon solar cells of disc, ribbon, or tube construction are employed. Output conduits such as water- or airpipes 36 or electrical wire connections 23, respectively, are provided for each embodiment.

Radiation entering any of these collectors from any direction in the upper hemisphere is concentrated near the center of the form where it impinges on the receiver and is converted to useful purposes such as direct heat or electricity.

This is true for all meridianal rays (which intersect the central axis) entering a rotated embodiment. Some skew rays (which do not intersect the central axis) entering a toroidal embodiment may leave the collector without impinging on the radiation receiver unless deflector plates 28 are installed as, for example, in FIGS. 2 et seq. Trough-like embodiments of this invention with an areal concentration factor of 1 are shown. Rotated embodiments with areal concentration factors of 4 or greater are shown also on FIGS. 2D—2H, and on FIGS. 3A, 4, and 5. Additionally, FIGS. 5 and 6 show combinations of trough-like and rotated embodiments.

The rotated embodiments preferably are arranged in an array to cover a given area (such as the roof of a house). There will inevitably be gaps that are not covered. Additional reflectors can be installed to deflect radiation directed toward these gaps so that it instead enters one of the individual collectors.

The toroidal collectors

Referring to FIG. 2A, a toroidal reflector 26, obtained by rotating FIG. 1 about axis 12, is shown.

Figure 2B:
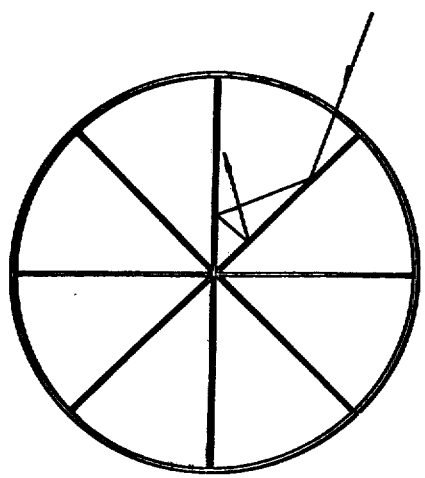

As shown on FIG. 2A for collecting skew rays, which are those that do not intersect the central axis, the invention provides radial plates 28 for diverting skew rays toward the center. These radial plates are thin to avoid blocking entering radiation at their upper edges. They have a reflective surface on each side. Preferably they are mounted on a wire frame which, for instance, can extend from a small hole in the central cusp. The central cusp is cut back slightly to expose the hole and to allow space for the wire frame and the receiver. The radial plates do not need to extend all the way into the central cusp 30. The number of these radial plates should be not less than six. Otherwise many skew rays will be reflected out of the collector without reaching the energy receiver. FIG. 2B is a plan view of FIG. 2A.

Figure 2C:
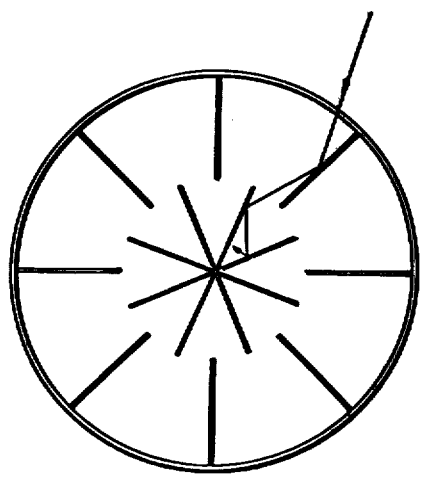

An alternative arrangement of radial plates is shown in plan view on FIG. 2C. The split and skewed radial plates in FIG. 2C are more effective than those of FIG. 2B at diverting skew rays toward the center. A typical skew ray is shown with the same initial angle of incidence in each of these Figures. In FIG. 2C the ray comes closer to the center so that there is more chance of its being reflected into an energy receiver. These radial plates are applicable also to the toroidal embodiments of FIGS. 2D–2H and to the spherical embodiments of FIG. 3 and to the polygonal embodiments of FIGS. 4 and 5. Similar plates, although not radial, may be installed in the embodiments of FIGS. 5.

Figure 2D:
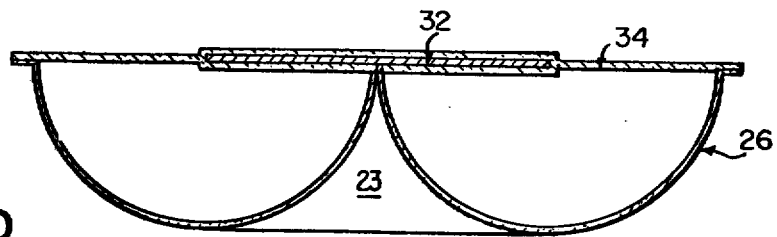

On FIG. 2D, a toroidal reflector 26, as in FIG. 2A, is shown fitted with a circular solar cell 32 encased in a clear plastic or glass cover plate 34. The solar cell should be one half the diameter of the toroid giving an areal ratio of 4 to 1. Conduit means 23 are provided for carrying away the electrical energy.

Figure 2E:
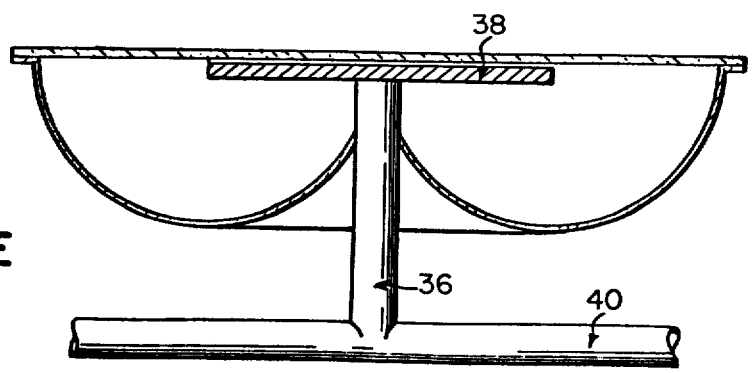

Referring to FIG. 2E, a toroidal reflector as in FIG. 2D is shown but in this case the reflector is mounted on a heat pipe 36 with a heat receiving disc 38 in place of the solar cell. The heat pipe extends centrally up through the cusp. The cooled end of the heat pipe is embedded in another pipe 40 through which a cooling liquid is pumped to carry the heat away.

On FIG. 2F, a compounded version of the toroidal collector of FIG. 2D is shown. Dimensions are shown in terms of the receiver radius "r" where the second hemitoroid is twice the size of the first hemitoroid. The device has an areal ratio of 12 to 1. Additional light can be collected by applying a reflective coating to the outer lower portion 42 of the upper hemitoroid. The reflective coating should extend from the rim 44 of the upper hemitoroid up the outer surface to a point 46 such that the angle θ is given by θ = Cos⁻¹ ⅓, or θ is approximately 70.5°. At point 46 the tangent to the upper hemitoroid intersects the rim of the lower hemitoroid so that above point 46 no light will be reflected into the collector. FIG. 2F also shows an angle α positioned at a typical point 48, centered about the extended radius line through point 48, and with one side intersecting the rim of the lower hemitoroid.

The angle β extends between the angle α and the tangent to the upper hemitoroid at point 48 as shown in the figure. Meridianal rays striking point 48 from directions within angle α will escape but those from directions within angle β will be collected.

On FIG. 2G, a further compounding of the toroidal collector is shown by a third hemitoroid, having a central hole with a radius of 2μ, said third hemitoroid mounted facing symmetrically and in opposition to the second hemitoroid; said third hemitoroid having an outer perimeter of radius three times that of said first hemitoroid to provide an areal ratio of collector aperture to receiver of 20 to 1. Again the outer lower portion 42 of the upper second hemitoroid should have a reflective coating but in this case the angle subtended by this lower portion 42 is given by θ = Cos⁻¹ ½ or θ is 60°. Further compounding is possible but will increase the number of reflections the radiation must undergo in reaching the receiver. Since some energy is lost at each reflection, extensive compounding is not productive unless surfaces of very high reflectivity are used. The figure shows the path of a typical ray.

While with this invention it is not necessary to track the sun, it is, of course, true that by tracking the sun the device will present its greatest aspect to the direct radiation. Tracking means can readily be adapted to this invention. A compounded toroidal collector is shown on 2H. It is similar to the device in FIG. 2F but has a centrally mounted pointing device for tracking the sun. Such a pointing device is described in U.S. Pat. No. 3,892,476. It has inner and outer confocal paraboloidal mirrors 62 and 64, four symmetrically located photocells 66 (only three are shown), and associated circuitry, amplifiers, and drive units. Means are provided to control the collector surface areas in response to the above tracking means.

Preferably the entire assembly is mounted in a gimbal suspension for universal limited movements in cartesian coordinates, as described in U.S. Pat. No. 3,892,476.

Whenever the light distribution in the pointing device is asymmetrical, the device will generate control signals to drive it into a symmetrical condition. It will thus track the sun, or, if the sun is obscured, it will track the brightest region of the sky. Under some lighting conditions it might point at a snow-covered field or other source of reflected light.

A mounting structure 68 provides support for the pointing device. It has the form of a truncated cone and is provided with a reflective coating to direct additional radiations into the collector.

As described in the above cited patent, the outer paraboloidal mirror may be fitted with a fifth centrally located solar cell. The output of all five cells is then combined as additional energy from this collector.

Because the device of FIG. 2H tracks the sun, the radial plates for diverting skew rays toward the center are not essential. They will, however, enhance the collection of dispersed radiation. The pointing device can be used with an individual collector as shown on FIG. 2H or it can be adapted to an array of collectors mounted on a common frame.

The hemispherical collectors

FIG. 3A shows a hemispherical reflector 26, obtained by rotating the semicircle of FIG. 1 about axis 10. Also shown are two solar cell ribbons 50, and means 29 for mounting them. There are shown outlet conduits 23 to means of use of converted energy, which are applicable also to FIGS. 3B and 3C. Radial plates 28 to deflect skew rays toward the center are shown installed in this reflector as described in connection with FIG. 2A. For solar cell ribbons "r" inches wide and "R" inches long, this hemispherical reflector of radius "R" gives an areal ratio of πR/2r to 1. The hemispherical reflector has an advantage over the toroidal reflector in that a typical ray of light undergoes fewer reflections on average to reach the receiver. However, the depth/dimension R is greater than the radius of an equivalent toroidal collector.

Referring to FIGS. 3B and 3C, alternative arrangements of solar cells for mounting into the hemispherical reflector are shown. FIG. 3B shows a column of three solar cell ribbons in a delta arrangement and FIG. 3C shows an equivalent column of a solar cell tube. The arrangements of FIGS. 3B and 3C have an added advantage in that much of the light impinging on the solar cells has a chance to make two passes through the solar cell material. Light that is not usefully absorbed on the first pass may be usefully absorbed on the second pass thus increasing the efficiency of the device.

In the hemispherical devices of FIGS. 3A, 3B and 3C, illumination of the solar cell material may not be uniform. This situation could lead to circulating electric currents in the solar cell material, production of heat, and lowered performance. To preclude such results the solar cell ribbons or tubes are wired in three or more separate segments along their lengths with each segment isolated by a blocking diode to prevent circulating currents.

The pipe of FIG. 3D is an optional substitution for the solar cell of FIG. 3A for circulating therethrough a cooling medium to carry away heat energy or alternately to function as a heat pipe 36 as in FIG. 2E, but without the absorbing disc 38.

The technology of producing solar cell ribbons of single crystal silicon is conventional and described for instance in the December 1975 article of Journal of the Electrochemical Society, "Solid-State Science And Technology", page 1702, col. 2. A similar technology is also used to produce tubes of single crystal sapphire material and has been used to produce tubes of single crystal silicon.

The polygonal collectors

To arrange reflectors in an array covering an area more completely they are preferably, in plan view, in the shape of an "n"-sided regular polygon. This can be achieved by using a number "n" of identical wedges taken from a semicircular cylindrical trough. The wedges have an angle at the narrow end of 360°/n; the "n" wedges are assembled with the narrow ends together to form a concave reflector with a central cusp and have, in plan view of the outer perimeter, the shape of an n-sided regular polygon; the radial, skew-ray deflector plates conform to the curved semicircular or semi-elliptical contours of the inner reflective surface; the radiations receiver mounted coplanar with the outer perimeter of the concave inner reflective surface is a disc one half the size of the n-sided regular polygon to provide an areal concentration ratio of collector aperture to receiver of approximately four to one.

Referring to FIGS. 4A and 4B a hexagonal reflector is shown. The reflector is made up of six 60° wedges 58 of a trough-like form. At the intersections of the various wedges semi-elliptical plates 60 are placed radially to divert skew rays toward the center as dicussed with FIG. 2A. The receiver is a circular disc of radius r. To avoid losing some meridianal rays the maximum radius of the hexagon must be 2r as shown in the FIG. 4B. This means that each of the trough-like wedges has a trough radius of ($\sqrt{3}/2$)r and that this collector has an areal ratio of 3.21 to 1.

Figure 4C:
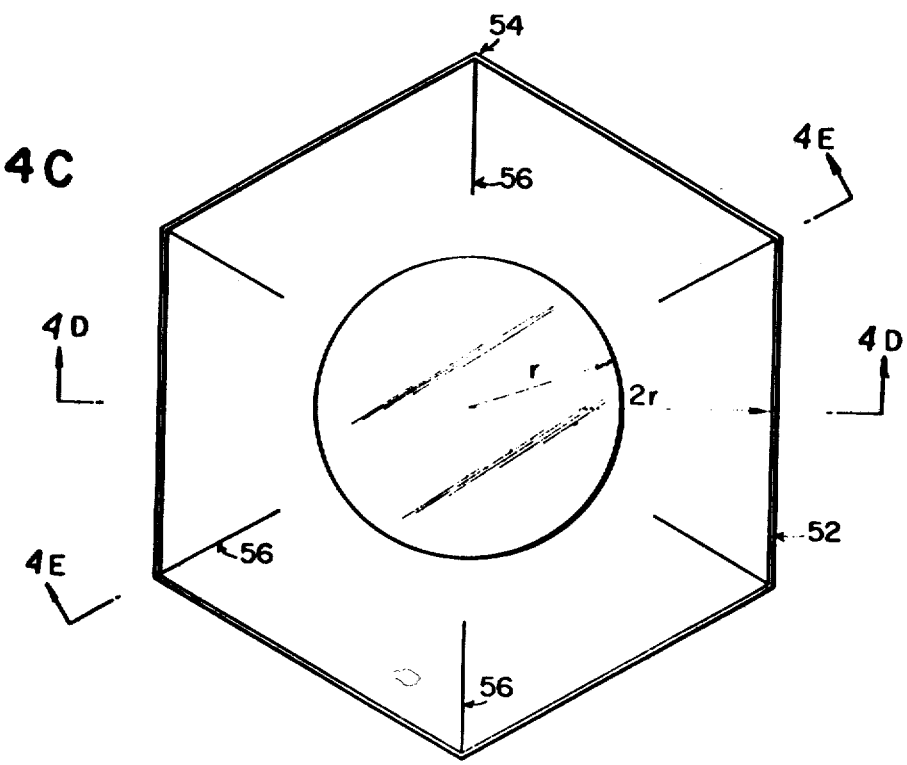
FIG. 4C is a plan view of a hexagonal collector, similar to that of FIG. 4A, but whose typical reflector cross section is of a different configuration.
Figure 4D:
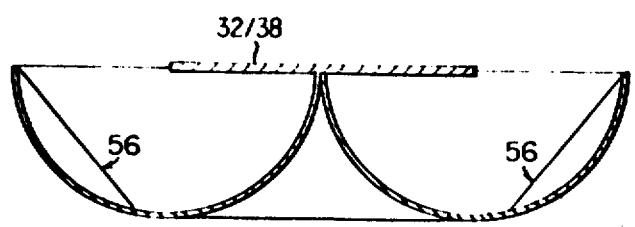
FIG. 4D is a cross section on plane 4D—4D of FIG. 4C.
Figure 4E:
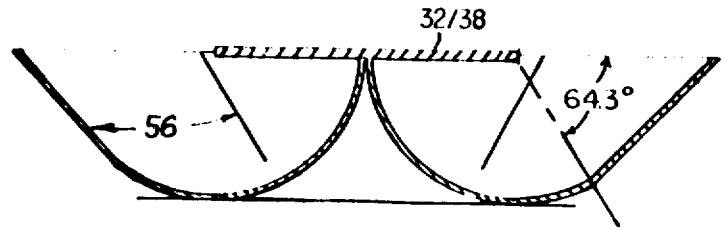
FIG. 4E is a cross section on plane 4E—4E of FIG. 4C.

Referring to FIGS. 4C, 4D, and 4E, the reflector shown is the same as that of FIG. 2D except that the periphery 52 has been expanded into the shape of a hexagon. The reflector is a true toroid of revolution except at the corners 54. At each corner an intersection 56 is shown where surfaces of different curvature meet. This intersection is shown as a straight line 56 extending 64.3° down the reflector as shown in FIG. 4E. While this is the preferred form of this embodiment, it is possible to use other forms in which the intersections 56 are not straight lines. Additionally, skew ray diverter plates as in FIG. 2A can be added to the reflector. This reflector has an areal ratio of 4.28 to 1.

The reflectors in FIGS. 4A to 5E can be compounded for higher concentration ratios.

When maximum coverage of a given area is required a square shape is selected for the collector forms to cover an area completely. This provides the higher concentration factors of the toroidal forms. FIGS. 5A to 5C illustrate a modified square collector in which the corners are of spherical form providing an areal ratio of about 3.8 to 1. It has four corner pieces 62 each of which is one-eighth of a spherical shell, and four side pieces 64 each of which is a truncated wedge from a semicircular cylindrical shell. The side pieces join at the center to form a central cusp 30. The corner pieces 62 and the side pieces 64 have the same radius which is one-fourth the width of the reflector. The four ridges 66 formed by the abutting side pieces 64 are in the shape of one-quarter ellipses. Skew-ray diverting plates can be applied to this reflector in a manner analogous to that discussed in connection with FIGS. 2A, 2B and 2C. This reflector permits the assembly of multiple units into an array as shown on FIG. 5D, which can cover a given area to about 95 percent. Additionally the reflector can be compounded in a manner analogous to that of FIGS. 2F and 2G.

FIGS. 4A and 4B and 5 illustrate how segments of the trough-like forms are assembled into collectors resembling hemitoroids but with polygonal perimeters such as squares or hexagons.

The collector panels

Referring to FIG. 5D, a heat collecting array using the reflector of FIGS. 5A, 5B and 5C is shown. The coolant pipes 68 penetrate through the side pieces 64 and the central cusps 30 are recessed to accomodate the heat receivers 70 and coolant pipes 68. Inlet and outlet pipes are shown as 72 and 74.

Referring to FIGS. 5E and 5F improved versions of sections 5BB and 5CC are shown. It is apparent from FIG. 1 that radiation such as ray D entering the collector parallel to the central axis and near the outer edge undergoes numerous reflections before reaching the receiver. Each reflection results in some loss of energy. For individual collectors, not assembled into an array, these reflection losses are not significant. The direct radiation intercepted is at a maximum when it is parallel to the central axis and any attempt to reduce the number of reflections will result in a loss of some of the radiant energy. Further, the outer portions of the collector are important in capturing dispersed and direct radiation from other angles.

By assembling the collectors into an array as shown on FIG. 5D the number of reflections can be reduced without loss of any significant portion of the incident radiation. To do this, the outer edge of each individual collector and its central cusp, is reduced by an angle $\delta$ as shown on FIGS. 5E and 5F. If the angle $\delta$ is $22\frac{1}{2}°$ then the average number of reflections for radiation entering parallel to the central axis is approximately one and the areal ratio is approximately 3.5 to 1. Additional reflectors can be positioned around the outer perimeter of the array to increase the energy collected. These considerations apply to each embodiment discussed earlier.

Depending on the individual installation and the space allowed for installing a transparent cover, the uncovered areas, or gaps, between individual reflectors may be fitted with analogous reflectors of a generally conical shape to deflect light directed toward the gaps into the collectors of the array.

The coolant pipes 68 may be beneath or above the heat receivers 70, or may pass through the interior of the heat receivers. In any event, there must be good contact between the coolant pipes and the heat receivers for efficient heat transfer. The receivers 70 and pipes 68 preferably have a black coating to receive an optimum input.

The array of heat collectors such as shown on FIG. 5D is readily adaptable for panel installation on the roofs or side walls of new constructions or existing buildings, preferably with an integral conventional construction backing such as made from plywood or other type insulating sheets.

Preferably the arrays are provided with readily interlockingly mating, or overlapping, airtight, rims to preclude penetration by rain water and also permit easy assembly into self-supporting solar energy collecting outdoor structures, which can be readily erected also independently of the buildings, new or old, and have only conduits of the collected energy connected to the buildings.

The conduits

When fluid conduits such as of water, air, antifreeze or other medium are employed, their in- and out-flow ends are provided preferably with snap-together mating junctions to permit safe and quick assembly of a plurality of collectors into panels and of panels into an array.

Similarly, conventional snap-in electrical wire connectors are employed when light-to electricity converters are employed.

The frame

A frame provides for insulation around and beneath the reflectors and for the support of one or more transparent covers to protect the array and minimize losses from reradiation and to carry the conduits. The frame optionally is employed also to point the collector toward an optimum radiation source in response to the command of a tracking means such as described.

The protective covers

Protective transparent covers are provided to minimize heat loss by reradiation.

These covers are either glass or plastic thin panels or films, covering each collector or the array of them and they are optionally provided with the overlapping or interlocking rims described. Preferably the material of the covers permits the short-wave light radiation to enter and obstructs exit of infra-red long-wave heat radiations.

The same type frames and covers scaled down to size are employed to protect individual collectors, if an array assembly is not desired.

Thus a panel optionally designed in accordance with the invention provides not only an optimum conversion of radiation into usable energy, but also a structural airtight insulated building unit integrally mating with others of the same type and preferably usable in lieu of roof shingles, bricks and other wall construction materials even by unskilled labor.

The energy-absorbing volume of the receiver is calculated at an optimum ratio to and is positioned optimally in relation to the aperture of the collector, the aperture being the plane area through which radiation must pass to reach the collectors reflective surfaces.

This consideration, however, does not suffice for receivers operating on a fluid flow principle. In such instances for optimum results the fluid flow must be controlled also in accordance with the laws of thermodynamics.

Thus in accordance with the invention in these instances temperature sensors are provided which in turn control fluid pumps with variable speed controls and variable flow outputs within preset maximum and minimum limits on flow and temperature.

A differential temperature sensor to control the variable or fixed speed pump is provided to control the fluid outflow. The pump will not come on unless the temperature at the energy receiver is a preset staggered amount such as 3° F., 5° F., 10° F., higher than the temperature of the cooling medium in the energy storage space. This prevents losing previously collected energy during periods (at night for example) when the radiation is low. Concentrating collectors of this invention will maintain a receiver temperature suitable for collecting energy at lower levels of radiation than will a flat plate collector. Thus they can be used effectively for more hours of the day.

Optionally, alternatively or simultaneously the variable speed pump is controlled also by the temperature of the coolant leaving the receiver. The speed is varied to maintain a constant temperature of the coolant leaving the receiver. Thus at low radiation the speed of the pump is kept low to reduce pumping power requirements. As radiation increases the pump speed and coolant flow increase to reduce the temperature rise and consequent increased radiation losses at the receiver. Additionally, where receivers of large area are employed, multiple, spaced conduits may be installed at each receiver to carry away collected energy and to maintain the receiver at lower temperatures thus limiting losses by reradiation and improving efficiency. Variables, such as insolation, efficiency, receiver temperature, load, conduit spacing and size, laminar or turbulent flow, etc. are involved. For most situations for every 4" of receiver width one ⅛" pipe will be sufficient. It can take flow of 1 gallon per minute or more without offering much resistance and can thus keep the receiver temperature at a low value. Or, the flow can be reduced to let output temperature increase if that is desired.

These and other thermal considerations are analyzed in detail in Duffie and Beckman, *Solar Energy Thermal Processes*, John Wiley and Sons, New York, 1974. For claim purpose the following definitions are used:

The concentration factor or areal ratio, is defined as the ratio between the area of the aperture of the collector and the area of the receiver. Rotational symmetry defines the situation that a geometric Figure or body is transformed into itself by some finite rotations about an axis—commonly the central axis. Also, usually, rotations are limited to a total of 360°. Thus, a circle is transformed into itself by any rotation about its center; a square has a 4-fold rotational symmetry (0°, 90°, 180°, and 270°), a pentagon a 5-fold rotational symmetry etc.. Any n-sided regular polygon has an n-fold rotational symmetry. Thus a rectangular shape (such as trough in plan view) has a 2-fold rotational symmetry (0° and 180°).

What I claim is:

1. A collector of direct, indirect, dispersed and reflected radiations from a remote Source, such as from the sun, comprising:
    A. at least one reflector having at least one concavity with an inner reflective surface;
    said concavity having:
        in at least two cross-sections, taken in planes passing in different directions through the central axis of symmetry, at least one semicircle in each plane; and at least three-fold rotational symmetry;
    said reflector forming a collector aperture defined by the largest plane area through which rediations pass to enter the collector, said aperture being the collector opening exposed to incoming radiations;
    B. at least one radiation receiver mounted about within the boundaries of the concavity and having at least one radiations receiving surface mounted at a location in opposition to said reflector,
        said receiver having a shape and dimension of surface areas in proportions to the reflector to intercept and absorb substantially all radiations from any direction reflected from the reflector
        said receiver providing an areal ration of collector aperture to receiver of about four to one and greater; and
    C. conduit means to deliver the absorbed radiation for useful purposes.
2. A collector of radiations as claimed in claim 1, further comprising means to mount said reflector with its concave reflective surface substantially facing the Source; and
    means to mount said receiver interposed between the reflector and the Source.
3. A collector of radiations as claimed in claim 2,
    said receiver having at least one additional surface to intercept also all direct nonreflected radiations entering the collector from the said Source.
4. A collector of radiations as claimed in claim 1, said reflector further comprising
    at least one radial skew-ray deflector plate with at least two reflective surfaces.

5. A collector of radiations as claimed in claim 4, said inner reflective surface comprising "n" identical wedges taken from a semicircular, cylindrical trough;
   said wedges having an angle at the narrow end of 360°/n;
   said "n" wedges being assembled with the narrow ends together to form a concave reflector with a central cusp and having, in plan view of the outer perimeter, the shape of an n-sided regular polygon;
   said radial, skew-ray deflector plates conforming to the curved contours of said inner reflective surface;
   said radiations receiver being mounted coplanar with the outer perimeter of the concave inner reflective surface, further being a disc one half the size of the n-sided regular polygon to provide an areal concentration ratio of collector aperture to receiver of about four to one.

6. A collector of radiations as claimed in claim 5, said radiations receiver being a circular disc.

7. A collector of radiations as claimed in claim 5, said concave reflector having each corner of said n-sided regular polygon shaped as a portion of a sphere;
   said sphere having a radius equal to that of said semicircular, cylindrical trough and inserted so that all surfaces join smoothly and all inner surfaces are reflective;
   said radial, skew-ray deflector plates conforming to the spherical contours at the corners.

8. A plurality of collectors as in claim 7, each said reflector being, in plan view, a square with rounded corners,
   said reflector having a narrow band at its outer perimeter removed so that the resulting perimeter is slightly below the plane of the radiations receiver.

9. A collector of radiations as claimed in claim 4, said radiations receiver including means to convert the radiations to heat energy.
   said conduits being fluid conduits.

10. A collector of radiations as claimed in claim 4, said radiations receiver including means to convert the radiations to electrical energy.
    said conduits being electrical conduits.

11. A plurality of collectors of radiations as claimed in claim 4 assembled into a panel of larger size;
    said collectors being shaped, sized, and assembled so that the optimum area of the panel can be utilized for collecting radiations.

12. A plurality of collectors as claimed in claim 11, each individual collector having a small portion of its outer perimeter removed so that the resulting perimeter is slightly below the plane of the radiations receivers.

13. A collector of radiations as claimed in claim 1, said receiver having a shape and dimensions of surface areas in proportions to the reflector to intercept and absorb all radiations impinging directly on said receiver.

* * * * *